(12) United States Patent
Singleton et al.

(10) Patent No.: US 10,254,776 B1
(45) Date of Patent: Apr. 9, 2019

(54) VOLTAGE REGULATION OF VIRTUAL EARTH NODES OF A DIFFERENTIAL SIGNAL PROCESSING CIRCUIT

(71) Applicant: Cirrus Logic International Semiconductor Ltd., Edinburgh (GB)

(72) Inventors: David Paul Singleton, Edinburgh (GB); Kapil Sharma, Edinburgh (GB)

(73) Assignee: Cirrus Logic, Inc., Austin, TX (US)

( * ) Notice: Subject to any disclaimer, the term of this patent is extended or adjusted under 35 U.S.C. 154(b) by 0 days.

(21) Appl. No.: 15/851,147

(22) Filed: Dec. 21, 2017

(51) Int. Cl.
*G05F 1/573* (2006.01)
*H03M 1/18* (2006.01)
*G05F 1/445* (2006.01)

(52) U.S. Cl.
CPC .............. *G05F 1/573* (2013.01); *G05F 1/445* (2013.01); *H03M 1/181* (2013.01)

(58) Field of Classification Search
CPC ......... G05F 1/445; G05F 1/573; H03M 1/181
USPC .................................. 323/222–225, 281–285
See application file for complete search history.

(56) References Cited

U.S. PATENT DOCUMENTS

| | | | | |
|---|---|---|---|---|
| 8,816,887 B2* | 8/2014 | Hurrell | ............... | H03M 1/1245 327/109 |
| 9,774,343 B1* | 9/2017 | Liaghati | ............... | H03M 1/181 |
| 2008/0284490 A1* | 11/2008 | Tenbroek | ............... | H03F 1/301 327/362 |
| 2010/0283445 A1* | 11/2010 | Ramaraju | ............... | G05F 1/56 323/299 |

* cited by examiner

*Primary Examiner* — Yemane Mehari
(74) *Attorney, Agent, or Firm* — Jackson Walker L.L.P.

(57) ABSTRACT

This application relates to methods and apparatus for voltage regulation. Embodiments relate to signal processing circuit (300) having a first and second processing path with respective first and second inputs (INP and INN). The first and second processing paths have respective first and second virtual earth nodes (108P and 108N) at the input to a differential integrator (106). A differential feedback path is configured to apply a feedback signal to each of the first and second virtual earth nodes so as to minimize any voltage difference between them. A regulator (301) is operable to monitor a voltage at one of the virtual earth nodes (108P) against a reference voltage ($V_{REF}$) and to generate a regulation signal to maintain the voltage at said monitored one of the first and second virtual earth nodes to be equal to the reference voltage. The regulation signal is applied to both of the first and second virtual earth nodes.

20 Claims, 3 Drawing Sheets

VOLTAGE REGULATION OF VIRTUAL EARTH NODES OF A DIFFERENTIAL SIGNAL PROCESSING CIRCUIT

TECHNICAL FIELD

The field of representative embodiments of this disclosure relates to methods, apparatus and/or implementations concerning or relating to voltage regulation, and especially to regulation of a common-mode voltage or virtual earth voltage in a differential signal processing circuit.

BACKGROUND

Differential signal processing is used in a number of different applications. One particular application is as part of a signal processing circuit for processing an input signal, for instance an audio signal, such as an input signal from a microphone.

FIG. 1 illustrates one example of a differential signal processing circuit, which is a continuous time sigma-delta analogue-to-digital converter (ADC) 100. A differential input signal may be received at first and second inputs, INP and INN, for first and second processing paths. Each processing path has a resistor 101 coupled to the input node so as to covert the signal voltage at the input to a signal current. A quantizer 102 comprising a voltage controlled oscillator (VCO) 103 and counter 104 is arranged in each processing path to perform analogue-to-digital conversion. The VCO 103 outputs an oscillation signal with a frequency that depends on the voltage input to the VCO and the counter 104 counts the number of oscillation cycles within a frame period to give a count value indicative of the frequency of the oscillation signal and hence the value of the voltage at the input to the VCO. The output from the quantizer 102 in the second processing path is subtracted from the output of the quantizer 102 in the first processing path to provide a digital output signal $D_{OUT}$ indicative of the differential input signal.

The output signal $D_{OUT}$ is also provided to a digital-to-analogue converter (DAC), which in this case is a current DAC (IDAC) 105 which provides feedback current signals to be combined with the signal currents in the first and second processing paths. The feedback is applied before a differential integrator 106, which in this example comprises an op-amp 107 that integrates the combined signal and feedback currents to provide the voltage input to the VCO 103.

This arrangement provides second order noise shaping and analogue-to-digital conversion and provides good performance for processing of fully differential signals such as may be received from some microphones.

However some microphones do not provide fully differential signals and may instead provide a single ended input signal. It may be desirable to use the same general signal processing circuitry for processing single ended signals, as true single ended signals or in a pseudo-differential fashion. However use of a differential signal processing architecture such as illustrated in FIG. 1 with one input left floating or held at a constant DC voltage can lead to a relatively large variation in common mode voltage which may require the use of components able to cope with a relatively large voltage swing, which may be relatively large in size and have relatively high power requirements.

SUMMARY

Embodiments of the present invention relate to differential signal processing circuitry that at least mitigate these issues.

According to some embodiments there is provided a signal processing circuit comprising:
a first processing path having a first input;
a second processing path having a second input;
the first and second processing paths comprising respective first and second virtual earth nodes at the input to a differential integrator;
a differential feedback path configured to apply a feedback signal to each of the first and second virtual earth nodes so as to minimise any voltage difference between the first and second virtual earth nodes; and
a regulator operable to monitor a voltage at one of the first and second virtual earth nodes against a reference voltage and to generate a regulation signal to maintain the voltage at the monitored one of the first and second virtual earth nodes to be equal to the reference voltage;
wherein the regulation signal is applied to both of the said first and second virtual earth nodes.

In some embodiments the regulator may comprise a regulator amplifier configured to provide the regulation signal as an output based on the difference between the voltage at the monitored one of the first and second virtual earth nodes and the reference voltage. The regulator amplifier may be configured to receive the voltage at the monitored one of the first and second virtual earth nodes at a first amplifier input and to receive the voltage reference at a second amplifier input. The regulator may comprise a first regulator input switch electrically connected between the first amplifier input and the first virtual earth node for selectively connecting the regulator amplifier to monitor the voltage at the first virtual earth node. The regulator may comprise a second regulator input switch electrically connected between the first amplifier input and the second virtual earth node for selectively connecting the regulator amplifier to monitor the voltage at the second virtual earth node.

In some embodiments the regulator is operable to electrically couple an output of the regulator amplifier to the first and second virtual earth nodes via respective first and second regulator resistors. The regulator may comprise respective first and second regulator output switches electrically connected between the respective first and second regulator resistors and the respective first and second virtual earth nodes for selectively disconnecting the first and second regulator resistors from the first and second virtual earth nodes. In some embodiments the regulator may be configured to open the first and second switches and disable the regulator amplifier in response to a control signal indicating that regulation is not required.

In some embodiments the reference voltage corresponds to a desired midpoint voltage of the signal processing circuit.

The regulator may be configured to apply regulation currents to the first and second virtual earth nodes based on the regulation signal. The signal processing circuit may comprise respective first and second input resistors electrically connected between the first and second inputs and the first and second virtual earth nodes respectively. The feedback path may be configured to apply the feedback signal as a feedback current signal. In some embodiments a current digital-to-analogue converter may be located in the feedback path and configured to generate the feedback current signal based on a digital output of the signal processing circuit.

In some embodiments the signal processing circuit may comprise an analogue-to-digital converter circuit. The first and second processing paths may comprise respective first and second quantizers configured to receive an output of the differential integrator and a subtractor configured to determine a difference value between an output of the first and second quantizers and output the difference value as a digital output signal. In some implementations each of the first and second quantizers may comprise a voltage-controlled oscillator and counter.

The signal processing circuit may be configured to receive an audio input signal.

Aspects also relate to an electronic device comprising a signal processing circuit according to any of the variants described herein.

In another aspect there is provided a signal processing circuit comprising:
a first processing path having a first virtual earth node;
a second processing path having a second virtual earth node;
a differential feedback loop configured to apply a feedback signal to each of the first and second virtual earth nodes so as to minimise any voltage difference between the first and second virtual earth nodes; and
a regulator operable to monitor a voltage at the first virtual earth node against a reference voltage and to apply a regulation signal to the first virtual earth node to maintain the voltage to be equal to the reference voltage;
wherein the regulation signal is also applied to the second virtual earth node.

In another aspect there is provided a signal processing circuit comprising:
a first processing path having a first input;
a second processing path having a second input;
the signal processing circuit being configured to generate an output signal based on a difference between an output of the first processing path and an output of the first processing path;
a digital-to-analogue converter configured to apply feedback to first and second nodes of the first and second processing paths respectively based on the output signal;
a voltage regulator configured to apply a regulation signal to each of the first and second nodes based on monitoring the voltage at just one of the first and second nodes.

BRIEF DESCRIPTION OF DRAWINGS

For a better understanding of examples of the present disclosure, and to show more clearly how the examples may be carried into effect, reference will now be made, by way of example only, to the following drawings in which.

DETAILED DESCRIPTION OF EMBODIMENTS

The description below sets forth example embodiments according to this disclosure. Further example embodiments and implementations will be apparent to those having ordinary skill in the art. Further, those having ordinary skill in the art will recognize that various equivalent techniques may be applied in lieu of, or in conjunction with, the embodiments discussed below, and all such equivalents should be deemed as being encompassed by the present disclosure.

As discussed above the circuit illustrated in FIG. 1 is a continuous time sigma-delta ADC that can usefully be used with good performance for fully differential input signals, such as may be received from some microphones for instance.

Some microphones however provide only a single ended signal. Nevertheless in some instances it may be desirable to use differential signal processing. For instance it may be desirable to operate in a pseudo-differential manner and provide a single ended input signal at one input and a voltage reference such as ground at the other input, e.g. for ground noise cancellation.

Also it would be desirable from a commercial perspective to be able to offer the same circuit to be able to operate with either a fully differential input or a single-ended input. This would avoid a device manufacturer needing to use different circuits for different microphones and could allow the same signal processing circuit to be used in applications where the type of microphone and type of input signal is not known in advance and/or may be varied in use.

Figure 1:
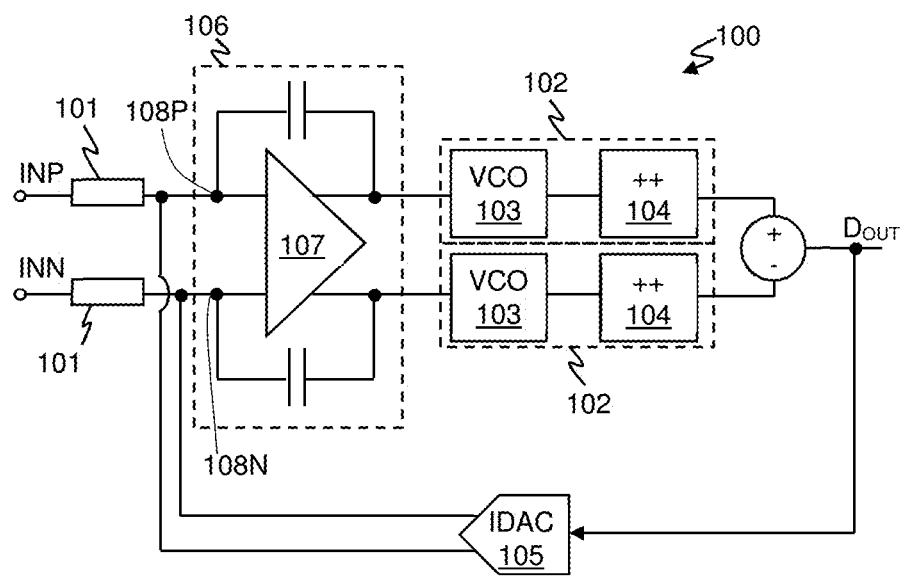
FIG. 1 illustrates one example of a sigma-delta ADC.

The arrangement illustrated in FIG. 1, if used for a single ended input, can however require the DAC 105 and op-amp 107 to be able to cope with a relatively large voltage swing.

In use, for a fully differential input signal, the action of the feedback of the ADC 100 of FIG. 1 is to try to maintain zero-differential signal at the input nodes 108P and 108N (collectively 108) to the differential integrator 106, i.e. to maintain virtual earth nodes 108P and 108N at the input to the integrator 106 at a constant voltage equal to the midpoint voltage. This means that output of the IDAC 105 and input to the op-amp 107 will experience a relatively low voltage swing in use.

However if a single-ended input signal is received at one input, say INP, and the other input is held at a constant DC voltage level, e.g. ground for ground noise cancellation, then as the same magnitude of feedback current is applied to each input of the integrator it is not possible to maintain a zero-differential voltage level, i.e. common-mode voltage.

Figure 2:
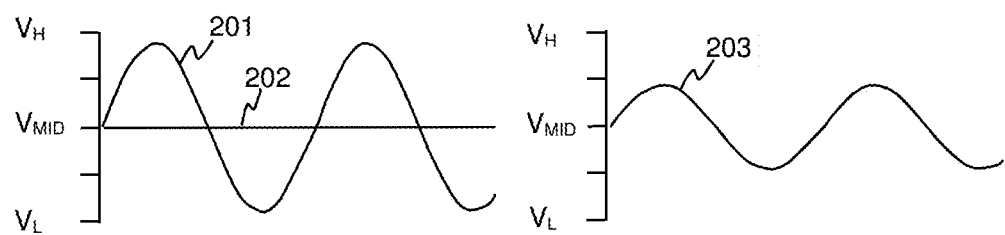
FIG. 2 illustrates how the voltage of the virtual earth nodes of the ADC circuit illustrated in FIG. 1 may vary in use when used with a single-ended input.

FIG. 2 illustrates example voltage waveforms that may be experienced at various parts of the circuit illustrated in FIG. 1. FIG. 2 illustrates that a time varying signal, represented by plot 201, may be received at the first input INP. In this example the signal is referenced to a midpoint voltage $V_{MID}$ and experiences a positive and negative voltage excursions (with respect to the midpoint voltage $V_{MID}$) between high-side and low-side voltage limits $V_H$ and $V_L$.

Note as used in this specification a reference to high-side shall be taken to mean more positive/less negative and a reference to low-side shall be taken to mean less positive/more negative. For example in some applications a microphone that produces a single ended output may be provided with voltage rails at a positive supply voltage, say around 1.8V in some implementations, and ground. In such a case the high-side voltage limit $V_H$ may be the supply voltage, e.g. 1.8V, with the low-side limit $V_L$ being ground and the midpoint voltage $V_{MID}$ may be 0.9V.

FIG. 2 illustrates that the second input INN may be held at a constant DC voltage, which in this example is the midpoint voltage $V_{MID}$. FIG. 2 also illustrates, on the right hand side, a plot 203 of the voltage at output of DAC for the second processing path, i.e. the input virtual earth node 108N of the integrator 106 for the second processing path.

This shows a voltage variation which varies according to $(V_{INP}-V_{INN})/2$ where $V_{INP}$ and $V_{INN}$ are the voltages at the first and second inputs INP and INN respectively. The virtual earth or input node 108P for the integrator 106 for the first processing path exhibits a variation which is substantially the same as plot 203. Thus the virtual earth nodes 108P and 108N for the integrator 106 exhibit a voltage ripple which is equal to half the signal swing at the first input INP.

In order to cope with this voltage ripple, without an increase in distortion, the IDAC 105, which has a high output impedance, and op-amp 107, with its wide input common-mode range on a limited VDD supply, of integrator 106 need to be relatively large components, which impacts on the size and power consumption of the circuit. In general, especially for portable electronic devices, size and power efficiency of the device components is important and it is generally desirable to reduce size (and hence cost) and/or power consumption where possible.

To avoid this problem a single ended input signal could be converted into a differential input by a front end amplifier located upstream of the ADC 100. However this would be relatively expensive in terms of circuit area and power as such an amplifier would directly impact the noise and linearity performance of the overall signal processing path and thus would need to be relatively high quality.

Alternatively, the feedback to the second processing path could be disabled so that feedback current is only applied to the virtual earth receiving the signal current and the other virtual earth remains static. However this results in poor linearity from the DAC (as one virtual earth has no feedback) and also provides a reduced dynamic range.

At least some embodiments of the present disclosure relate to differential signal processing circuits having first and second signal processing paths with feedback, in which virtual earth nodes of the first and second processing paths, and in particular virtual earth input nodes of a differential integrator, are regulated so as to maintain the voltage at the virtual earth nodes at a DC level with low levels of voltage ripple, e.g. to maintain a substantially constant DC level or at least reduce the extent of any voltage variation. In at least some embodiments the voltage at just one of virtual earth nodes is monitored against a reference and such monitoring is used as the basis for applying regulation signals to both of the virtual earth nodes.

Figure 3:
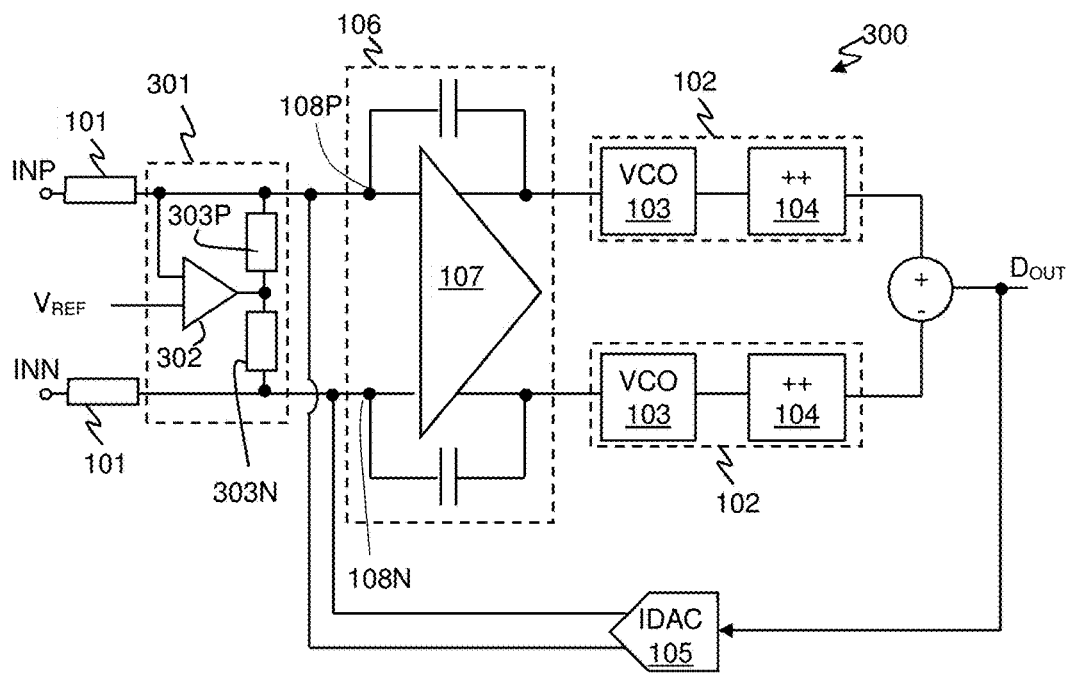
FIG. 3 illustrates one example of a differential signal processing circuit according to an embodiment.

FIG. 3 illustrates one example of a differential signal processing circuit according to an embodiment. FIG. 3 illustrates a differential continuous-time sigma-delta ADC 300 which is similar to that discussed with reference to FIG. 1 and in which similar components are identified by the same reference numerals. The embodiment of FIG. 3 includes a regulator 301 for regulating the voltages at the virtual earth nodes 108P and 108N.

The regulator 301 comprises an amplifier 302 configured to generate an output regulation signal $S_{REG}$ based on the difference between the voltage at one of the virtual earth nodes 108P or 108N and a reference voltage $V_{REF}$. The amplifier 302 in this example receives the voltage at the monitored virtual earth node, 108P in the example of FIG. 3, at a first amplifier input. In this example the amplifier also receives the reference voltage $V_{REF}$ at a second amplifier input. The reference voltage $V_{REF}$ corresponds to the voltage level to which it desired to maintain the virtual earth nodes. In some implementations the reference voltage $V_{REF}$ may correspond to the midlevel voltage $V_{MID}$ to which the input signal is referenced.

The output regulation signal $S_{REG}$ from the amplifier 302 is applied to both the first and second virtual earth nodes 108P and 108N, in this example via respective first and second regulation resistors 108P and 108N to convert the regulation signal voltage to appropriate regulation currents.

In use the voltage at the monitored virtual earth node, 108P in this example, is thus monitored against the reference voltage $V_{REF}$. In the event that the voltage at the monitored virtual earth node 108P varies, the regulator 301 will act to provide a regulation signal to this virtual earth node 108P to maintain the voltage at the desired level.

The embodiment makes use of the fact that the action of the feedback path is such that the circuit tries to maintain zero-differential voltage at the virtual earth nodes 108P and 108N. Thus the regulator 301 acts to keep the voltage at the monitored virtual earth node at a constant DC level and the feedback acts to keep the other virtual earth node at the same voltage level.

If a fully differential input signal is received at the inputs INP and INN and the regulator 301 is provided with the midpoint voltage $V_{MID}$ as the voltage reference $V_{REF}$, the regulator 301 may have substantially no impact on operation of the ADC 300. The feedback of the ADC 300 will operate as discussed above to maintain zero-differential voltage at the virtual earth nodes 108P and 108N at the level of the midpoint voltage $V_{MID}$. Thus the voltage at the virtual earth node monitored by the regulator 301 will not vary significantly.

If however an input signal is applied which is not a true differential signal, such as single-ended signal, then any signal current that would move the monitored virtual earth away from the reference voltage is compensated for via a regulation current through the regulator resistors 303P and 303N (collectively 303). The same current is also delivered to the other virtual earth thus converting the single-ended input signal to a fully-differential current signal at the input to the integrator 106.

Embodiments of the present invention thus can operate with a fully differential input signal and can also operate with input signals that are not true differential signals, such as single-ended or pseudo-differential input signals. For single ended input signals the action of the regulator 301, in conjunction with the feedback, convert the input signal into a fully differential signal.

The regulation signal $S_{REG}$ output from the amplifier 302 is applied to both virtual earth nodes 108P and 108N. This means that the regulation signal $S_{REG}$ is effectively rejected by the integrator 106 of the ADC 300. The amplifier 302 is not itself in the main signal path and as such the performance requirements of the amplifier 302 may be relatively relaxed. Thus the regulator amplifier 302 may be implemented as a relatively low power and/or low size amplifier and the size and power requirements associated with the regulator amplifier 302 may be significantly reduced compared to the possible alternative approach of using an initial signal path amplifier to convert a single-ended signal into a differential signal. The regulator amplifier 302 should have an output range which is sufficient for the expected input signal, taking into account any gain due to the input resistor 101 and regulator resistor 303P, however the inputs to the regulator amplifier 302 are relatively static and thus the regulator amplifier 302 can readily be implemented without any undue design considerations. The regulator resistors 303P and 303N do contribute some noise and do increase the noise gain of the integrator amplifier 107, however this noise contribution is not significant and does not significantly impact the figure-of-merit (FOM) of the circuit 300.

As the output of the regulator 301 is applied to both virtual earth nodes the regulation can be seen as regulating the common-mode voltage of the differential signal processing circuit at the nodes 108P and 108N. The regulator 301 can thus be seen as a regulator for regulating the common-mode of differential signal processing circuit. Embodiments of the disclosure thus equally relate to differential signal processing circuitry with a regulator for regulating the common-mode of the signal processing circuitry. It will be appreciated by one skilled in the art that the embodiment discussed in FIG. 3 provides regulation of the common-mode voltage without requiring common-mode feedback to the sigma-delta loop. Adding common-mode feedback to the sigma-delta loop could be alternative approach but would generally result in a more complex implementation which could require a feedforward path around the integrator. Such an approach would likely add complexity and hence cost and power and an advantage of using an integrator without a feedforward path is that it acts as an anti-aliasing filter.

As noted above the regulator 301 regulates the voltage at the monitored virtual earth node, e.g. 108P, and the action of the feedback of the ADC 300 stabilises the other virtual earth node, e.g. 108N. It will be appreciated by one skilled in the art that this requires two loops to stabilise. Such an arrangement may normally be avoided as it could be a source of instability as the loops could fight each other. However it has been found that, at least for the signal ranges and frequencies expected for received audio signals, e.g. as may expected to be received from a microphone, the loops stabilise satisfactorily.

Figure 4:
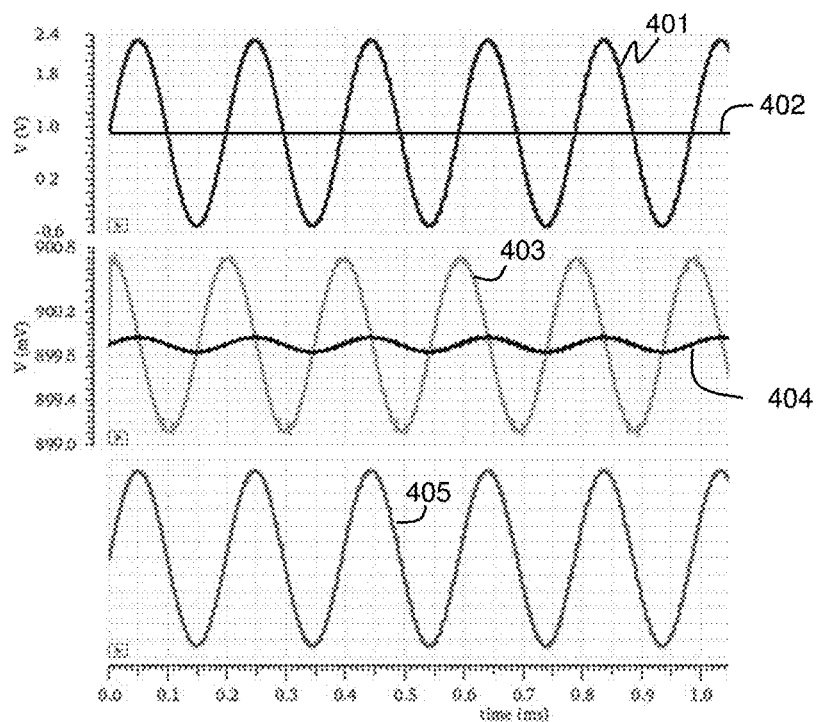
FIG. 4 illustrates simulated waveforms showing how the voltage of the virtual earth nodes of the circuit illustrated in FIG. 3 may vary in use when used with a single-ended input.

FIG. 4 illustrates simulated waveforms for the circuit as illustrated in FIG. 3. FIG. 4 shows that a time varying voltage waveform 401 is applied to the first input INP whilst a constant DC voltage 402 at the midpoint voltage $V_{MID}$, in this instance 0.9V, is applied to the second input INN. This represents a large amplitude single-ended signal being applied—in this instance with a voltage amplitude of about 1.4V. FIG. 4 also shows a plot 403 of the voltage at the first virtual earth node 108P and a plot 404 of the voltage at the first virtual earth node 108N (it should be noted that the scale of the top plot is in volts and the scale of the middle plot is in millivolts). Due to the finite gains in the ADC circuit 300 there is some voltage ripple on the virtual earth nodes, however the maximum amplitude of the voltage ripple is of the order of about 1 mV in this example. This is an relatively insignificant ripple as far as the IDAC 105 and integrator 106 tolerance are concerned and thus the IDAC 105 and integrator 106 can be implemented on the basis that the voltage at the virtual earth nodes 108P and 108N are substantially static. This significantly reduces the power and size requirements compared to the arrangement illustrated in FIG. 1 without regulation.

It will be understood that as only one virtual earth node is monitored and directly regulated by the regulator 301, the regulation can be seen as unbalanced. Such unbalanced regulation may result in an error current in the virtual earth node that is not monitored, meaning that a different magnitude of ripple may be observed on the monitored virtual earth node (108P in FIG. 3) as compared to the other virtual earth node (108N in FIG. 3). This difference in voltage ripple on the virtual earth nodes can be seen in plots 403 and 404 in FIG. 4. This mechanism is a cause of nonlinearity in the ADC circuit 300 when operating with single-ended input signals. However the distortion introduced is relatively small and, for many applications, will be acceptable given the advantages offered by the regulator 301.

FIG. 4 also shows a plot 405 illustrating the current through the regulation resistors 203P and 203N. It can be seen that the current follows the applied input signal 401 and is generally equal to $(V_{INP}-V_{INN})/(2 \cdot R_{303})$ where $R_{303}$ is the resistance of each of the regulator resistors 303P and 303N. It will be understood that to apply the same regulation current to each of the virtual earth nodes 108P an 108N the regulator resistors 303P and 303N will generally be chosen to have the same value of resistance as one another.

The value of the resistance of the regulator resistors 303P and 303N will be selected for a particular application. As noted above the amplifier 107 of the integrator 106 sees an increased noise gain due to the presence of the regulator resistors, with the increased noise gain being of the order of $(R_{101}+R_{303})/R_{303}$ when referred to the input, where $R_{101}$ is the resistance of the input resistors 101. The noise of the regulator resistors 303 sees a gain of $R_{101}/R_{203}$ when referred to the input. In some implementation the regulator resistors 303 may be selected to have a resistance of the order of the resistance of the input resistors, say of the order of a few tens or hundreds of kilo-ohms for example.

In some embodiments the resistance value of the input resistors 101 may be variable in use, for example to vary the gain of the ADC 300, i.e. the input resistors 101 may be variable resistances. In such a case it may be advantageous in some implementations to also implement the regulator resistors 303 as variable resistances and to vary the resistance of the regulator resistors 303 so as to maintain a relatively constant ratio between the resistance of the input resistors 101 and that of the regulator resistors 303, i.e. so that the input signal and regulations signal $V_{REG}$ maintain a common gain factor.

In some embodiments it may be advantageous to be able to remove the noise contribution of the regulator 301 when the regulator is not required. As noted above, if the input signal is a fully-differential input signal the regulator 301 is not required, but the presence of the regulator 301 will not substantially interfere with correct operation of the signal processing circuit 300. However there will still be a noise contribution from the regulator resistors 303. Thus, in instances where it is known that a fully differential input signal will be received, the regulator 301 may be disabled in a way that reduces or avoids the noise impact from the regulator resistors 303. Disabling the regulator 301 when not required can also reduce the power consumption of the signal processing circuit 300.

Figure 5:
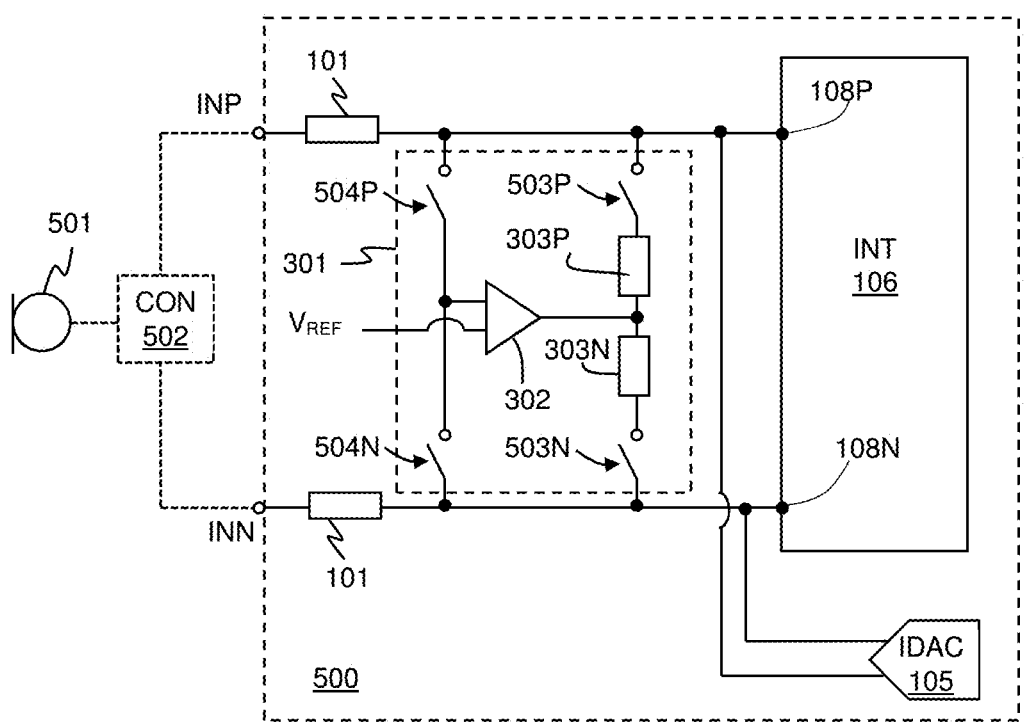
FIG. 5 illustrates another example of a differential signal processing circuit according to an embodiment.

FIG. 5 illustrates an example of a differential signal processing circuit 500, having an integrator 106 with input virtual earth nodes 108P and 108N and feedback via an IDAC 105. The signal processing circuit 500 may for instance be an ADC circuit such as described above with reference to FIG. 3. The signal processing circuit 500 of FIG. 5 has a regulator 301 which can be selectively enabled or disabled.

FIG. 5 illustrates that the inputs INP and INN of the signal processing circuit 500 will, in use, be connected to receive an input signal, for example an analogue audio signal such as may be generated by a microphone 501. In some implementations the microphone 501 may form part of a host device housing the signal processing circuit 500, in which case the type of microphone 501 and the type of microphone output, e.g. single ended or fully differential may be known at the time of device fabrication. In some implementations however the signal processing circuit 500 may additionally or alternatively be operable to receive, in use, microphone signals from a microphone which is external to the host device, for example a microphone 501 of an accessory apparatus (not separately illustrated). Such an external microphone 501 may be removably connected to the host device via a suitable connector 502 of the host device, such as a jack-socket for receiving a mating jack-plug of the accessory apparatus.

FIG. 5 illustrates the regulator 301 with first and second regulator output switches 503P and 503N connected in series between the regulator resistors 303P and 303N respectively and the respective virtual earth node 108P and 108N. If it is known that a fully differential input signal will be received at the inputs INP and INN, the regulator resistors 303 may be disconnected from the virtual earth nodes 108 by opening the regulator output switches 503P and 503N. The regulator amplifier 302 could be disabled so as to prevent a high-impedance to the monitored virtual earth node. In this way the operation of the regulator may be disabled, saving power associated with operation of the regulator, and also avoiding the regulator resistors 303 from contributing to the noise of the signal processing circuit 500.

If, however, it is known that the input signal is not a fully differential signal and is a single-ended input signal or pseudo-differential signal, the regulator amplifier 302 may be enabled and regulator output switches 503P and 503N closed to enable regulation as described previously. As will be understood by one skilled in the art, a pseudo-differential input may be advantageous in some applications, for instance for receiving a single ended microphone signal from an microphone 501 of an external accessory apparatus where one input INN or INP is coupled to ground for ground noise cancellation. The regulator 301 may also be enabled when the type of input signal that may be received is not known in advance. As noted above an advantage of the regulator 301 of embodiments of the disclosure is that it can cope with a fully differential input signal or with a single-ended or pseudo-differential input signal.

As noted above when the regulator 301 is active the regulator amplifier 302 monitors the voltage at one of the virtual earth nodes 108P or 108N against the voltage reference $V_{REF}$. Either virtual earth node 108P or 108N may be monitored and regulation will work, irrespective of which input INP or INN receives the time varying signal of interest. Thus in some embodiments it could be the virtual earth node of the processing path to which a constant DC level is applied as input which is monitored and directly regulated by the regulator 301. However in general it may be advantageous in terms of linearity to monitor the virtual earth of the processing path to which the time varying signal of interest is applied as an input. Thus if the single-ended signal component is applied to the first processing path it may be preferred to monitor the first virtual earth node 108P whereas if the single-ended signal component is applied to the second processing path it may be preferred to monitor the second virtual earth node 108N.

Thus in some embodiments it may be advantageous to provide regulator input switches 504P and 504N for selectively connecting the regulator 301 to monitor the first virtual earth node 108P or the second virtual earth node 108N as desired. The relevant node to be monitored may be determined in some instances at the time of fabrication or in use based on a suitable control signal from some other circuitry that determines the type of input signal.

It will be appreciated of course that the regulator input switches 504P and 504N for allowing selection of the relevant virtual earth node 108P or 108N for monitoring may be implemented in some embodiments without the regulator output switches 503P and 503N. It will also be understood that regulator output switches 503P and 503N could be present in some embodiments to allow for disabling of regulation without regulator input switches 504P and 504N.

However in some instances at least one of the regulator input switches 504P and 504N could be present along with regulator output switches 503P and 503N and opened at the same time as regulator output switches 503P and 503N when regulation is not required.

Whilst regulation of a fully differential signal may not be required to prevent voltage variations at the virtual earth nodes 108, in some embodiments however it may be useful to apply regulation to the virtual earth nodes 108 when a differential signal is applied to regulate the virtual earth nodes 108 to a desired DC voltage. The regulator 301 can, in effect, compensate for a DC offset of the input differential signal. Thus if an input fully differential signal is received at the inputs INP and INN and such signal has a common mode voltage with a DC offset from the desired midlevel voltage $V_{MID}$ for the signal processing circuit, the regulator 301 will operate to effectively correct for the DC offset at the virtual earth nodes 108. Thus is the regulator amplifier 302 has sufficient output current capability then it can be used to handle a wide range of input DC levels for differential input signals.

In general therefore embodiments of the disclosure relate to differential signal processing circuits with feedback, and to regulation of the common mode voltage of the signal processing circuit. At least some embodiments relate to differential signal processing circuits with feedback to try to maintain a zero differential voltage between a first virtual earth node of a first processing path and a second virtual earth node of a second processing path. In some embodiments a regulator is configured to monitor the first virtual earth node against a reference and to derive a regulation signal which is applied to both the first and second virtual earth nodes.

Embodiments provide the ability for the same signal processing circuitry to handle fully differential input signals but also single-ended input signals without requiring any initial high quality amplifier to convert the single-ended signal into a differential signal. The operation of the regulator provides single-ended to differential conversion without requiring a high quality and hence large and/or high power amplifier. This approach for single-ended to differential conversion represents another aspect of embodiments of the disclosure and thus some embodiments relate to a differential signal processing circuit with a regulator for converting a single-ended input to a differential signal.

It will be understood that the embodiments have been described with reference to a suitable regulator having a regulator amplifier for applying a regulation signal $S_{REG}$ to the virtual earth nodes, in the illustrated examples via regulator resistors. However a similar effect could be achieved in other ways, for instance monitoring circuitry could control current sources or the like to provide a regulation current. Nevertheless the regulator described with reference to FIGS. 3 and 5 is an advantageous regulator that can be implemented in relatively low power and small area circuitry.

The skilled person will recognise that some aspects of the above-described apparatus and methods, for example the discovery and configuration methods may be embodied as processor control code, for example on a non-volatile carrier medium such as a disk, CD- or DVD-ROM, programmed memory such as read only memory (Firmware), or on a data carrier such as an optical or electrical signal carrier. For many applications, embodiments will be implemented on a DSP (Digital Signal Processor), ASIC (Application Specific Integrated Circuit) or FPGA (Field Programmable Gate Array). Thus the code may comprise conventional program code or microcode or, for example code for setting up or controlling an ASIC or FPGA. The code may also comprise code for dynamically configuring re-configurable apparatus such as re-programmable logic gate arrays. Similarly the code may comprise code for a hardware description language such as Verilog™ or VHDL (Very high speed integrated circuit Hardware Description Language). As the skilled person will appreciate, the code may be distributed between a plurality of coupled components in communication with one another. Where appropriate, the embodiments may also be implemented using code running on a field-(re) programmable analogue array or similar device in order to configure analogue hardware.

At least some embodiments may be implemented in a host device, especially a portable and/or battery powered host device. Some embodiments may be implemented in an electronic device which may comprise at least one of: a communication device, a mobile or cellular telephone, a smartphone; a computing device; a laptop, notebook or tablet computing device; a media player; a games device; a wearable device; a smartwatch; a voice controlled device.

It should be noted that the above-mentioned embodiments illustrate rather than limit the invention, and that those skilled in the art will be able to design many alternative embodiments without departing from the scope of the appended claims. The word "comprising" does not exclude the presence of elements or steps other than those listed in a claim, "a" or "an" does not exclude a plurality, and a single feature or other unit may fulfil the functions of several units recited in the claims. Any reference numerals or labels in the claims shall not be construed so as to limit their scope.

The invention claimed is:

1. A signal processing circuit comprising:
a first processing path having a first input;
a second processing path having a second input;
the first and second processing paths comprising respective first and second virtual earth nodes at the input to a differential integrator;
a differential feedback path configured to apply a feedback signal to each of the first and second virtual earth nodes so as to minimise any voltage difference between the first and second virtual earth nodes; and
a regulator operable to monitor a voltage at one of said first and second virtual earth nodes against a reference voltage and to generate a regulation signal to maintain the voltage at said monitored one of the first and second virtual earth nodes to be equal to the reference voltage;
wherein the regulation signal is applied to both of the said first and second virtual earth nodes.

2. A signal processing circuit as claimed in claim 1 wherein the regulator comprises a regulator amplifier configured to provide the regulation signal as an output based on the difference between the voltage at said monitored one of the first and second virtual earth nodes and the reference voltage.

3. A signal processing circuit as claimed in claim 2 wherein the regulator amplifier is configured to receive the voltage at said monitored one of the first and second virtual earth nodes at a first amplifier input and to receive the voltage reference at a second amplifier input.

4. A signal processing circuit as claimed in claim 3 wherein the regulator comprises a first regulator input switch electrically connected between the first amplifier input and the first virtual earth node for selectively connecting the regulator amplifier to monitor the voltage at the first virtual earth node.

5. A signal processing circuit as claimed in claim 3 wherein the regulator comprises a second regulator input switch electrically connected between the first amplifier input and the second virtual earth node for selectively connecting the regulator amplifier to monitor the voltage at the second virtual earth node.

6. A signal processing circuit as claimed in claim 2 wherein the regulator is operable to electrically couple an output of the regulator amplifier to the first and second virtual earth nodes via respective first and second regulator resistors.

7. A signal processing circuit as claimed in claim 6 wherein the regulator comprises respective first and second regulator output switches electrically connected between the respective first and second regulator resistors and the respective first and second virtual earth nodes for selectively disconnecting the first and second regulator resistors from the first and second virtual earth nodes.

8. A signal processing circuit as claimed in claim 7 wherein the regulator is configured to open the first and second switches and disable the regulator amplifier in response to a control signal indicating that regulation is not required.

9. A signal processing circuit as claimed in claim 1 wherein the reference voltage corresponds to a desired midpoint voltage of the signal processing circuit.

10. A signal processing circuit as claimed in claim 1 wherein the regulator is configured to apply regulation currents to the first and second virtual earth nodes based on said regulation signal.

11. A signal processing circuit as claimed in claim 1 comprising respective first and second input resistors electrically connected between the first and second inputs and the first and second virtual earth nodes respectively.

12. A signal processing circuit as claimed in claim 1 wherein said feedback path is configured to apply the feedback signal as a feedback current signal.

13. A signal processing circuit as claimed in claim 12 comprising a current digital-to-analogue converter in the feedback path configured to generate said feedback current signal based on a digital output of the signal processing circuit.

14. A signal processing circuit as claimed in claim 1 wherein the signal processing circuit comprises an analogue-to-digital converter circuit.

15. A signal processing circuit as claimed in claim 14 wherein the first and second processing paths comprise respective first and second quantizers configured to receive an output of the differential integrator and a subtractor configured to determine a difference value between an output of the first and second quantizers and output said difference value as a digital output signal.

16. A signal processing circuit as claimed in claim 15 wherein each of said first and second quantizers comprises a voltage-controlled oscillator and counter.

17. A signal processing circuit as claimed in claim 1 configured to receive an audio input signal.

18. An electronic device comprising a signal processing circuit as claimed claim 1.

19. A signal processing circuit comprising:
a first processing path having a first virtual earth node;
a second processing path having a second virtual earth node;
a differential feedback loop configured to apply a feedback signal to each of the first and second virtual earth nodes so as to minimise any voltage difference between the first and second virtual earth nodes; and a regulator operable to monitor a voltage at the first virtual earth node against a reference voltage and to apply a regulation signal to the first virtual earth node to maintain the voltage to be equal to the reference voltage;

wherein the regulation signal is also applied to the second virtual earth node.

20. A signal processing circuit comprising:

a first processing path having a first input;

a second processing path having a second input;

the signal processing circuit being configured to generate an output signal based on a difference between an output of the first processing path and an output of the first processing path;

a digital-to-analogue converter configured to apply feedback to first and second nodes of the first and second processing paths respectively based on the output signal;

a voltage regulator configured to apply a regulation signal to each of the first and second nodes based on monitoring the voltage at just one of the first and second nodes.

* * * * *

UNITED STATES PATENT AND TRADEMARK OFFICE
CERTIFICATE OF CORRECTION

PATENT NO. : 10,254,776 B1
APPLICATION NO. : 15/851147
DATED : April 9, 2019
INVENTOR(S) : Singleton et al.

It is certified that error appears in the above-identified patent and that said Letters Patent is hereby corrected as shown below:

In the Claims

Please amend Claim 18 as follows:
18. An electronic device comprising a signal processing circuit as claimed in claim 1.

Signed and Sealed this
Seventeenth Day of September, 2019

Andrei Iancu
*Director of the United States Patent and Trademark Office*